United States Patent [19]
Barnes et al.

[11] Patent Number: 5,452,510
[45] Date of Patent: Sep. 26, 1995

[54] METHOD OF MAKING AN ELECTROSTATIC CHUCK WITH OXIDE INSULATOR

[75] Inventors: Michael S. Barnes, San Francisco, Calif.; Robert P. Westerfield, Jr., Montgomery, N.Y.

[73] Assignee: International Business Machines Corporation, Armonk, N.Y.

[21] Appl. No.: 169,910

[22] Filed: Dec. 20, 1993

[51] Int. Cl.$^6$ .................................................. H01R 43/00
[52] U.S. Cl. ................. 29/825; 29/458; 29/460; 29/527.2; 29/527.4; 29/530
[58] Field of Search ................. 29/825, 527.1, 29/527.2, 527.4, 530, 874, 876, 877, 885, 557, 558, 458, 460; 156/292, 330; 361/234; 279/128; 269/8

[56] References Cited

U.S. PATENT DOCUMENTS

| | | | |
|---|---|---|---|
| 4,645,218 | 2/1987 | Ooshio et al. | 269/8 |
| 5,055,964 | 10/1991 | Logan et al. | 361/234 |
| 5,099,571 | 3/1992 | Logan et al. | 29/825 |
| 5,103,367 | 4/1992 | Horwitz et al. | 361/234 |
| 5,166,856 | 11/1992 | Liporace et al. | 279/128 |
| 5,184,398 | 2/1993 | Moslehi | 29/825 |
| 5,213,349 | 5/1993 | Elliot | 279/128 |

*Primary Examiner*—David P. Bryant

[57] ABSTRACT

An electrostatic chuck and method of manufacture of the chuck in which the component parts are machined, then partially anodized to provide a hard insulating surface on surfaces that are not in contact with the wafer, and then assembled, after which the top surface abutting the workpiece is machined and a correction radius is cut to suppress discharges between the electrodes.

8 Claims, 5 Drawing Sheets

METHOD OF MAKING AN ELECTROSTATIC CHUCK WITH OXIDE INSULATOR

TECHNICAL FIELD

The field of the invention is that of electrostatic chucks for holding a workpiece by electrostatic attraction between the workpiece and one or more electrodes in the chuck.

BACKGROUND ART

Extensive work has been done in electrostatic chucks within the last ten years. An example is the chuck illustrated in U.S. Pat. No. 5,055,964, issued to the International Business Machines Corporation. The chuck disclosed herein is an improvement on that chuck. Another indication of work in wafers is an article in the IBM Technical Disclosure Bulletin Vol. 19, No. 6, November 1976 entitled "Gas Cooling". U.S. Pat. No. 3,993,123 illustrates the use of gas to conduct heat between abutting surfaces, the gas being present in the irregularities between two nominally flush surfaces and permeating the available space by diffusion from a low impedance supply area. The gas pressure is nominally atmospheric, well above a transition value characterized by the equivalence of the mean free path of the gas and the average distance between the surfaces.

Another problem is that of fabricating a planar surface to support a semiconductor wafer and forming passages for the flow of coolant gases in the planar surface while avoiding electric breakdown through the dielectric coating between the two electrodes of a bipolar chuck such as that disclosed in the patent cited above.

SUMMARY OF THE INVENTION

The invention relates to an electrostatic chuck and method of manufacture of the chuck in which the component parts are machined, then partially anodized to provide a hard insulating surface on surfaces that are not in contact with the wafer, and then assembled, after which the top surface abutting the workpiece is machined and a correction radius is cut to suppress discharges between the electrodes.

DETAILED DESCRIPTION OF THE INVENTION

Figure 1:
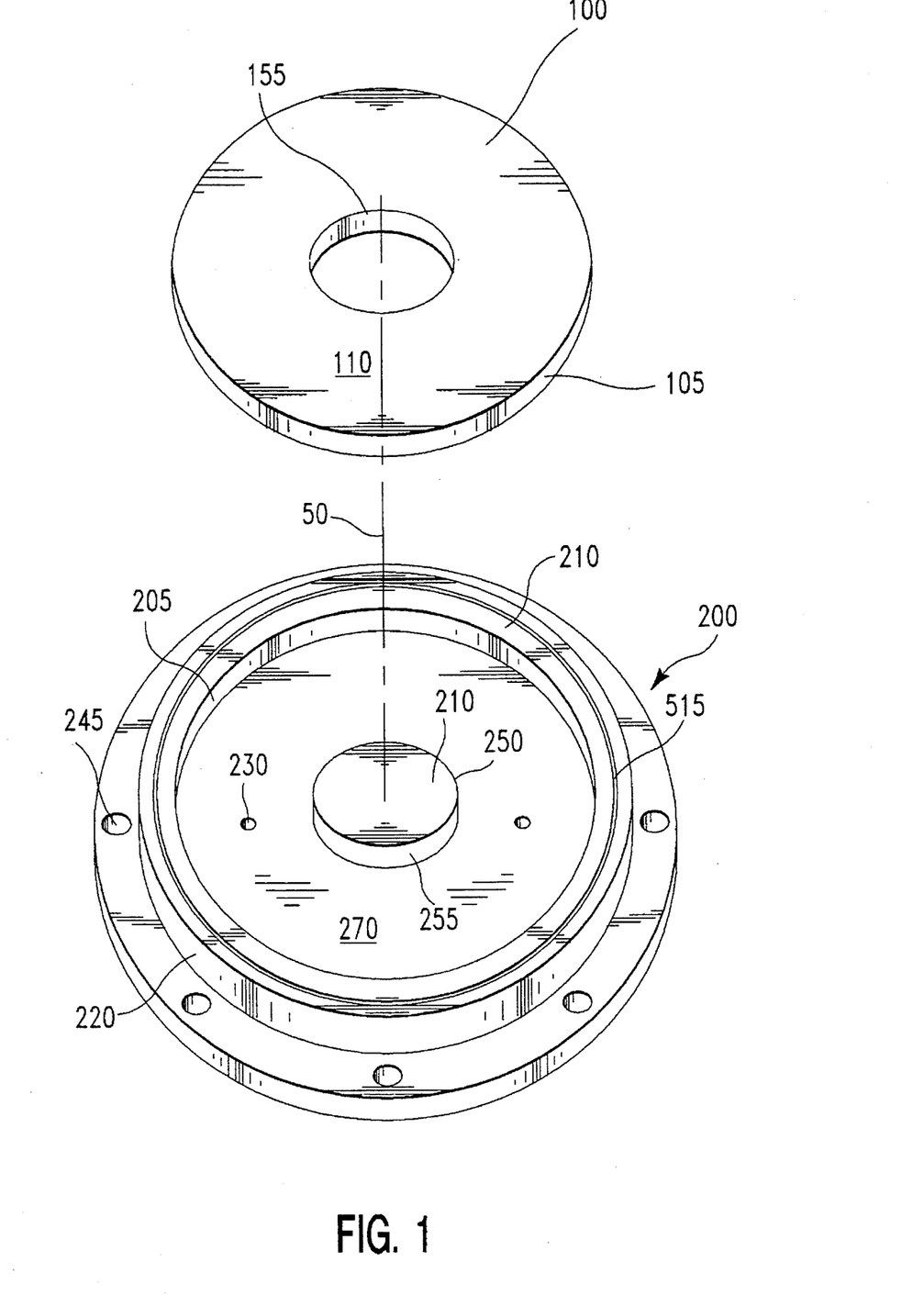
FIG. 1 illustrates in perspective an exploded view of a chuck according to the invention.

Referring now to FIG. 1, there is shown in exploded view, a bipolar or split electrode electrostatic chuck, in which base electrode 200, the larger portion of the chuck, has an electrode recess 270 machined in it to hold second electrode, or ring electrode, 100, ring electrode 100 being displaced along axis 50 in order to illustrate the chuck with greater clarity. Electrode 200 has a raised center hub 250 that defines, together with rim 220 of base electrode 200 a top surface 210. As is known in the art, bipolar chucks attract semiconductor wafers or other workpieces to surface 210 by electrostatic attraction of induced charges on the lower surface of the workpiece and fringing fields extending up to the workpiece from the capacitor formed by electrodes 100 and 200.

It is the purpose of the invention to provide a high clamping force on the workpiece by the use of a small gap between the electrodes that is formed between two thin layers of high quality dielectric while still retaining the advantage of the cited '964 chuck of having as planar a surface as possible over the entire face of the chuck.

Referring again to FIG. 1, it can be seen that ring electrode 100 has an inner vertical surface 155 that will have an inner recess gap between it and corresponding vertical surface 255 of center hub 250 after assembly. There is a corresponding pair of outer surfaces 105 and 205 that define a second outer recess gap. It is important, to provide consistency in clamping force, that these gaps be defined precisely and that they be repeatable. At the bottom of recess 270 there are illustrated two apertures 230 that are used to permit the passage of lifting pins to raise ring electrode 100 up so that top surface 110 is coplanar with surface 210 of base electrode 200. The initial thickness of electrode 100 is made to allow a coupling gap between the bottom of recess 270 (the oxidized recess depth) and the bottom of electrode 100 (i.e. allowing for an oxidized thickness of electrode 100) of nominal thickness 0.001" to 0.003", typically 0.002".

Figure 2:
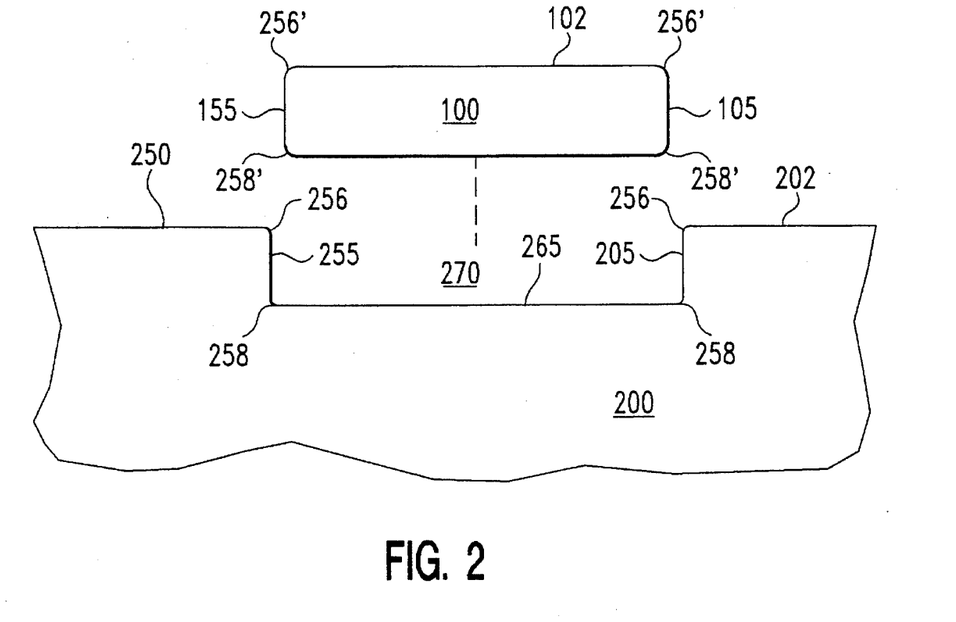
FIG. 2 illustrates a cross-section of a portion of the chuck of FIG. 1.

Referring now to FIG. 2, there is shown a cross-section of electrode 200 through recess 270. Ring electrode 100 is shown displaced for clarity. In recess 270, a top radius denoted by the numeral 256 is machined between surface 250 and surface 255. Illustratively, this surface has a radius of curvature of 0.015 inch. A corresponding bottom corner denoted with the numeral 258 between side surface 255 and bottom surface 260 has a radius of curvature of 0.060 inch. Preferably, these radii are machined by a numerically controlled lathe using carbide, ceramic, or diamond tooling. Corresponding radii for electrode 100 are 0.015 inch for radius 256' at the top and 0.090 inch for radius 258' on the bottom.

The final cut of the top surfaces of both electrodes 100 and 200 in the preferred method is made in a profile operation with a nominal depth of cut of 0.002 inch and a turning rate of the workpiece to produce a smooth surface having a nominal finish of 2 microinches that facilitates the formation of a high quality dielectric coating. The full surfaces of electrode 100 are also final machined, with the top surface being machined to the same standard.

Both electrodes 100 and 200 have an oxidation surface layer denoted by the numerals 102 and 202, respectively, that is formed in a process such as the ALUMILITE (registration of the Aluminum Company of America) process that, at a minimum, meets the requirements of military specification no. MIL-A-8625 Type III, Class 1 and produces a heavy, dense coating. For ease of reference, such a coating will be referred to as "hard-coat oxide" Aluminum alloy 6061-T6 is a preferable base material.

It has been found that it is important for the production of a heavy, dense oxide that the material be tested and extensive sampling is required in order to locate billets that are satisfactory. Those skilled in the art are aware that the processing steps, aging after fabrication, grain size and chemical composition all affect the quality of an oxide coating. The simplest method of selection is simply anodizing a test piece.

The main requirement of the insulation, whether it be hard-coat anodization, alumina, or any other insulator, is that the coating be as non-porous as possible, so that the electrical breakdown voltage of the insulator is as high as possible. The higher the breakdown voltage the smaller the gaps between the electrodes can be. Preferably, the breakdown strength should be at least 500 volts per mil. Insulators 102 and 202 are preferably applied to produce a final thickness of 0.002 inch. Porosity is also important in this application. If the plasma can penetrate through the pores and contact an electrode, then there can be either an arc through the plasma or the electrode can be brought to the plasma potential, thereby declamping that electrode.

Figure 3A:
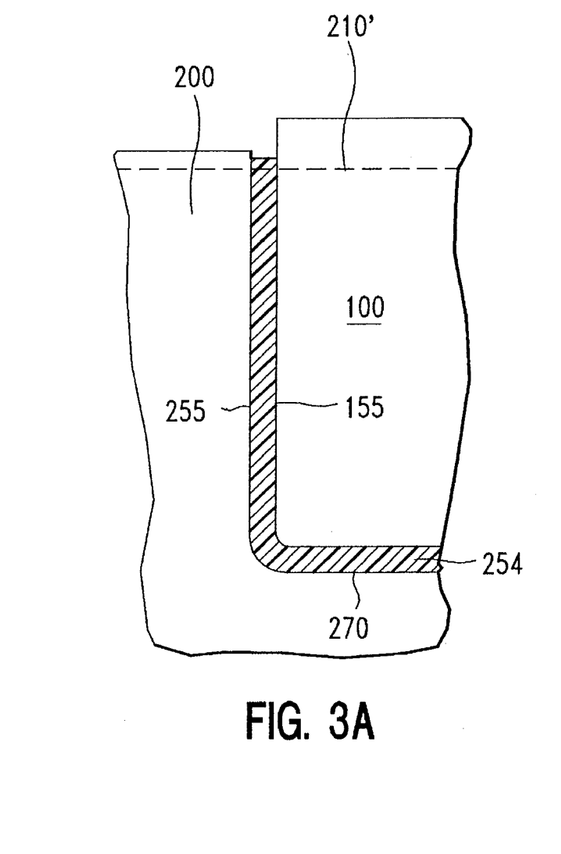
FIGS. 3A–3C illustrate in more detail a portion of the chuck in FIG. 1.

Referring now to FIG. 3, there is shown a detail of a chuck according to the invention, in which the top surfaces of electrodes 100 and 200 are machined to final size after assembly. This method is an improvement on the method of the cited '964 patent as described below. The area shown is the joint between electrodes 100 and 200, near the center of the chuck. In FIG. 3A, oversized electrodes 100 and 200 have been aligned and bonded together after an initial anodization step in which the top surfaces 110 and 210 were masked off. Surfaces 255 and 155 have been anodized as has the bottom of pocket 270 and the bottom of electrode 100. This bottom anodizing step is optional, depending on the quality of the insulation used and the degree of current leakage that can be tolerated. After alignment as described below, the electrodes have been bonded with an electrically insulating epoxy 254 such as H70S. As can be seen in FIG. 3A, the epoxy has been filled above line 210' that will be the final top surface of the electrodes.

Figure 3B:
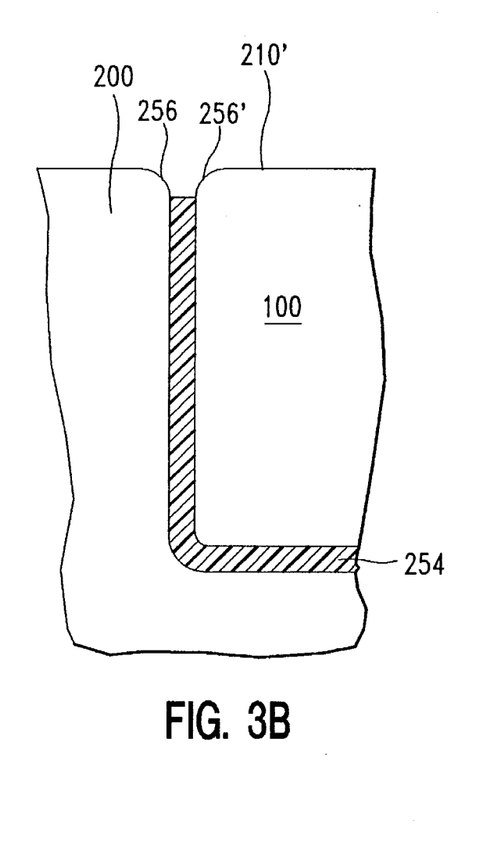
Figure 3C:
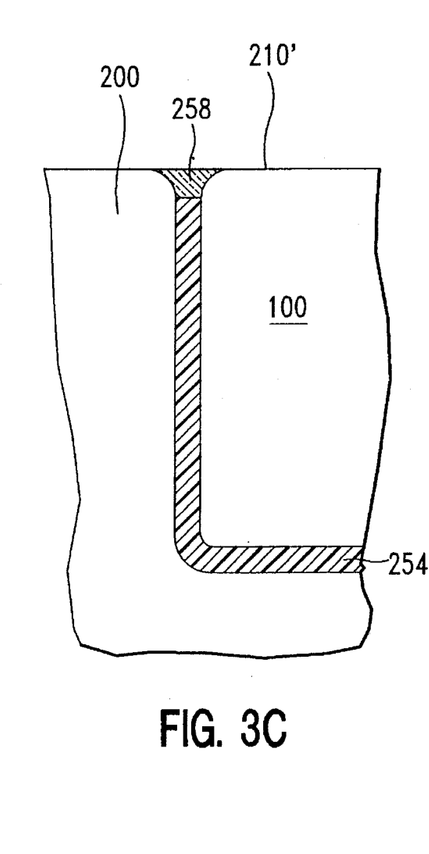

In the next figure, 3B, the top of both electrodes has been finish machined to a finish of four microinches (approaching two microinches) and radii 256 and 256' have been machined. In the machining step, the anodization coating was first scored with a diamond scribe and then a plunge cut operation was performed in which a tool having the appropriate radius (256, 256') is plunged into the epoxy 254 and moved about the circumference of electrode 100. In the example, radius 256 was 0.030 inch. After the plunge cut operation, the top and outer surfaces of the chuck are anodized. Subsequent to anodization, another layer of electrically insulating epoxy 258 is applied to fill the gap created between radii 256 and 256'. One of ordinary skill in the art would not think to machine off the first anodization coating prior to the plunge cut operation because it is known that machining hard coat anodization results in a rough surface because the coating is brittle and tears off instead of being machined smoothly. The machining could be extended further inward to give a new smooth surface, but there would then be a greater horizontal step in the vertical surface caused by a) the extra machining and b) by the fact that the oxide forms by growing into the aluminum. Such a step is of course undesirable because there will be high field strength at the step, with an attendant increase in the danger of current leakage. In addition, the interface between the new and old epoxies (258 and 254), which will have a lower resistance for current leakage because the bond between the two epoxies will not be as uniform as the bonds within the volume of an epoxy mass, will be at the vertical position of the steps. There will inevitably be some step or sharp change in radius because at least a minimum amount of aluminum must be removed. The radii 256 and 256' may be chosen to be different (using two tools and two machining operations) so that the steps will be separated by a vertical amount. In addition, one skilled in the art would be aware that aluminum particles will be generated in the machining process and may become lodged in the epoxy, giving rise to a weak spot that will provide electrical breakdown. Chips may be picked out manually and/or a secondary plunge cut removing only epoxy may be done after machining radii 256, 256' to remove remaining aluminum chips and also to lower the joint between old and new epoxy so that the bond line is not at the same height as the discontinuity between old and new anodization.

The sequence of steps is:
1. Rough machine the outer dimensions of electrodes 100 and 200.
2. Finish machine pocket 270
3. Finish machine 155, 255 and bottom of 100; jig-bore dowel pin locating holes in electrodes 100 and 200.
4. Anodize pocket 270 surfaces 155, 255, and bottom of 100. Mask top surfaces of electrodes 100 and 200.
5. Score a line 210' with a diamond tool bit at the base of the area to be plunge cut. Coat anodized surfaces with polyimide. Optionally machine off the hard coat anodization above the diamond scribe line.
6. Bond electrodes 100 and 200 using dowel pin alignment and techniques and an electrically insulating epoxy 254 such that leakage current the electrodes will be less than 1 microamp.
7. Plunge cut machine radii 256 and 256'; finish machine surfaces 210' and all remaining outer surfaces of the chuck.
8. Anodize surfaces 210' and outer surfaces of chuck;
9. Seal plunge cut radii with thermally conductive electrically insulating epoxy 258.

Optionally, a polyimide sheet may be inserted between the electrodes if the temperature will be above 20 degrees C.

The thickness of ring electrode 100 is made smaller than the nominal depth of recess 270 to allow for a nominal gap of 0.002 inch between the bottom surfaces after the bonding step. Uniformity of this gap is relevant for plasma-assisted etching steps in which RF power is fed through the chuck to sustain the plasma. Since the RF will ordinarily be capacitively coupled through bottom gap 112 in the area of electrode 100, less power will be fed through in that area because of the impedance of this capacitor, and the etching process may be affected in this area if the process is highly sensitive the amount of power. Different processes will have different power sensitivities and those skilled in the art will readily be able to measure the sensitivity of their processes. Chucks used in processes that do not have applied RF will not be affected by this consideration and may have larger gaps. Alternatively, each of electrodes 100 and 200 may be fed RF power directly through appropriate adaptive circuits.

Figure 4:
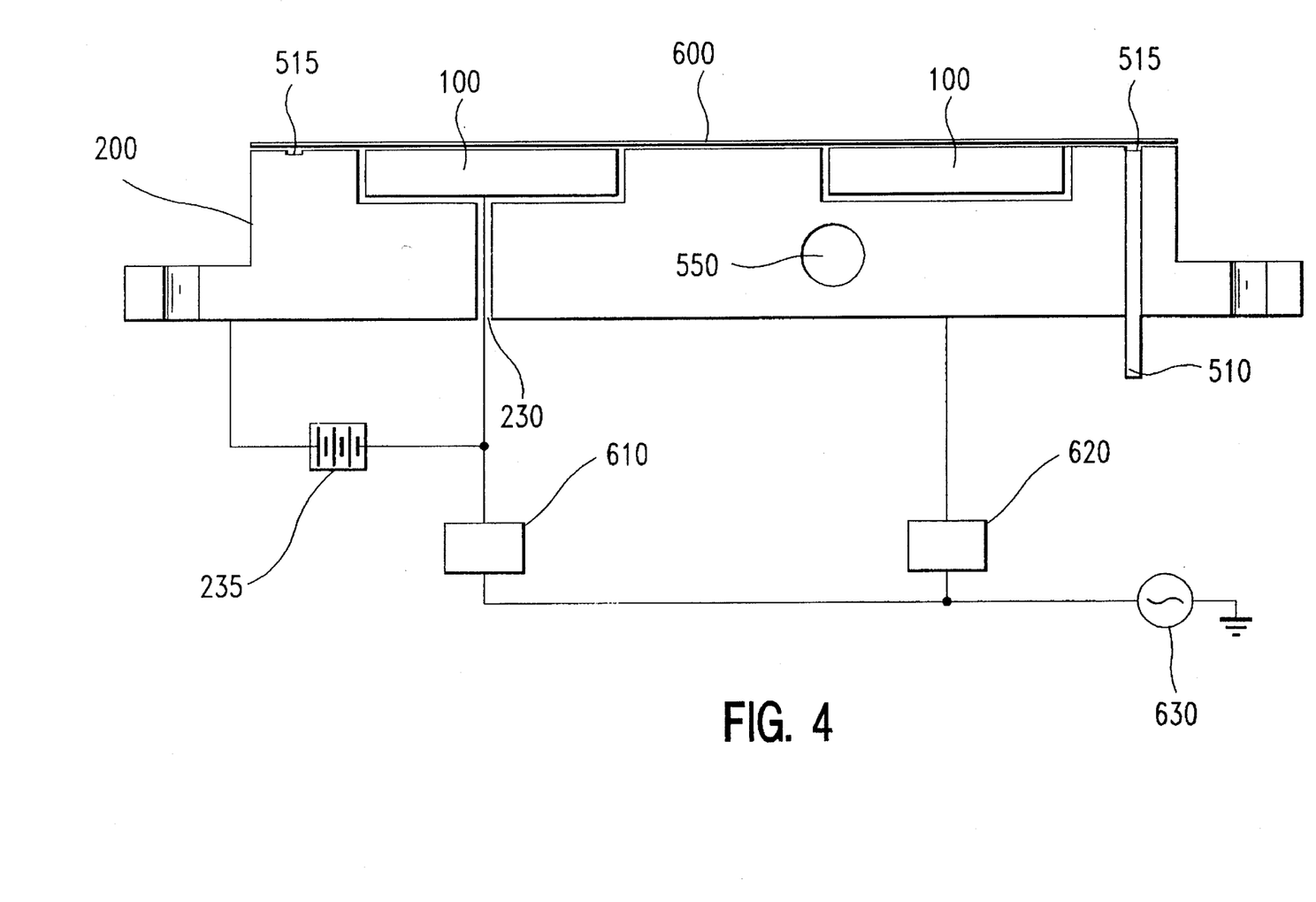
FIG. 4 illustrates in cross-section the chuck of FIG. 1 showing details of the gas cooling arrangement.

Referring now to FIG. 4, there is illustrated in cross-section, partially pictorially and partially schematically, a portion of a chuck according to the invention showing details of cooling passages for gas cooling of the workpiece. At the right of the figure, a gas, such as helium or argon, passes upwardly through channel 510 through electrode 200 into a channel denoted by the numeral 515 that passes around the rim of electrode 200. The heat transfer gas will diffuse in radially and azimuthally from passage 515 and then stop diffusing once the pressure within the interstices between the two surfaces is equal to that of passage 515. Since there is no impedance path in the interior along which gas can flow to an outlet, there can be no pressure drop and the pressure will necessarily be uniform.

Those skilled in the art will appreciate that the mechanism used herein to maintain the pressure between the chuck and the wafer at a nominal value (10 Torr, say) that is much greater than the nominal pressure of the chamber (order of magnitude 0.5 mTorr–2 Torr) is that of flowing gas outwardly through the impedance of the short path between rim passage 515 and the ambient vacuum. Pressure within passage 515 is equal to the "impedance" of the constricted passages between wafer 600 and base electrode 200 times the flow, in analogy to Ohm's law. Thus, it can be seen that, given the impedance set by the roughness of the surfaces and the attractive force between the chuck and wafer 600, it is essential to flow a predetermined amount of gas sufficient to maintain the pressure in the desired range. This approach of maintaining in order to establish pressure is sharply different from such prior art as U.S. Pat. No. 5,103,367, showing the use of O-ring seals or other elastomeric seal to prevent any flow. Such seals are subject to attack by the plasma on the outer edge.

U.S. Pat. No. 4,512,391 shows a chuck using mechanical clamps and having a large chamber of thickness at least as great as the wafer (>0.02 inch) in which gas within the chamber can flow freely to equalize any pressure. Sealing is provided by mechanical clamps pressing the wafer with great force against a raised lip at the outer edge of the chuck that defines the gas chamber. Since clamping is applied only at the edges, the clamping pressure in the clamping area must be greater than the attracting pressure in an electrostatic chuck at least in the ratio of clamping areas. If the clamping pressure for an electrostatic chuck is 20 Torr (the pressure of the coolant gas that will pop the wafer off the chuck), then the total clamping force is 20 Torr$\times A_{total}$, where $A_{total}$ is the total area of the chuck. For a mechanically clamped chuck to apply the same total force on a reduced clamping area $A_{clamp}$, the pressure in the clamping area must be 20Torr ($A_{total}/A_{clamp}$). For example, in the case of a 200 mm diameter chuck with a lip 5 mm wide, $A_{total} = \pi 100^2 \text{mm}^2$, $A_{clamp} = \pi(100^2 - 95^2)\text{mm}^2$, and the ratio $A_{total}/A_{clamp} = 10.3$. Such a mechanically clamped chuck must exert a clamping pressure at least ten times as great as that of the electrostatic chuck and therefore will have a correspondingly better seal, since sealing is a monotonic increasing function of pressure.

Illustratively, the diameter of passage 510 is 0.030 inch for a nominal length of 0.375 inch and the diameter of passage 512 below it is 0.125 inch. Passage 510 should not support a glow discharge, so that conventional baffles or other means should be used to ensure that Paschen's law is not satisfied so that a glow discharge does not develop. Long runs of gas lines should be decoupled from the chuck (e.g. by the use of quartz tubing or insulated tubing) and in cases packed with Teflon miniature tubing to reduce the exposed volume of gas.

Distribution passage 515 has a nominal depth of 0.020 inch and a radius of curvature where it meets the top surface 220 of electrode 200 of 0.010 inch and radii of curvature of 0.020 inch at the bottom. The intersection of groove 515 and passage 510 may be radiused if desired.

An advantage of this configuration of azimuthal distribution through a low impedance distribution groove about the periphery and radial distribution through diffusion compared with configurations having low impedance radial grooves connecting a set of circular grooves is that sharp corners are formed where grooves intersect and present a threat of arcing through the cooling gas to the wafer, the arcs being initiated by the high fields at the corners. Those skilled in the art can readily appreciate that many other configurations of gas coolant flow are known in the art. For example, a central aperture may be used as a feed, with the gas flowing radially into the ambient vacuum. This version has the disadvantage that the pressure will vary with radius and thus that there will be some variation in cooling efficiency.

Preferably, the gas pressure is such that the mean free path is considerably less than the average distance between surface 210 and the back of wafer 600. With this condition, referred to as the high pressure regime, the thermal conductivity of the gas film is substantially independent of pressure over a range from about one Torr up to atmospheric pressure. In the low pressure regime, where the mean free path is greater than or equal to the average distance, the thermal conductivity is an exponentially declining function of pressure. Operation in the low pressure regime is taught in U.S. Pat. No. 4,909,314. In contrast to the terminology of that patent, the terminology used here is the standard convention that "conduction" refers to heat transport by repeated molecular collision substantially without mass flow and "convection" refers to heat transport by the motion of energetic particles from one location to another, usually but not necessarily with net mass flow. Thus, in the low pressure regime, the heat transfer is by convection since a particle acquires energy at the hot wafer and travels to the cold base without collision where it gives up its energy when it collides with the base.

Figure 6:
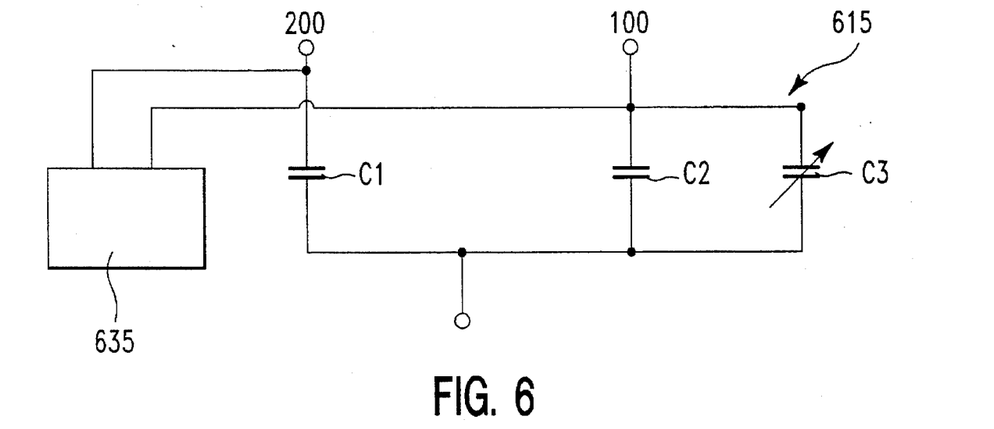
FIG. 6 illustrates an RF coupling circuit according to the invention.

Aperture 550 represents a passage for cooling fluid, such as water, flowing perpendicular to the plane of the paper in this figure. The use of coolant water is optional, depending on the heat that must be removed from the workpiece by the chuck. On the left of the figure are found electrical connections for both DC voltage and RF power. The DC voltage is a nominal 600 volts applied between electrodes 200 and 100. The value can range broadly, depending on the application, from nearly zero to about 800 volts. The RF connection is a nominal 1000 watts at 13.56 MHz for a chuck diameter of 200 mm. The RF frequency and power will be determined by the manufacturer of the chamber in which the chuck will be mounted and will vary with the type of etching gas, the material being etched, the size of the wafer, and the size of the chamber. It is fed from generator 630 to two boxes labeled 610 and 620 which represent conventional impedance matching and power distribution subsystems that are connected to electrodes 200 and 100, respectively. A conventional DC power supply 235, isolated by low-pass filters as shown in FIG. 6, supplies the DC bias. Those skilled in the art will readily appreciate that the RF power may be applied at various points to effect a balance between the power coupled to the plasma above electrode 200 and that coupled above electrode 100. For example, there may be a single feed to electrode 200 with capacitive coupling through gap 112 to electrode 100; there may be a direct connection to one of the electrodes with an impedance matching/power balancing system to the other electrode; or electrode 200 and/or 100 may be connected at a number of points. The feed may be used to compensate for the extra capacitance between base electrode 200 and electrode 100 and therefore to make the power coupled into the plasma equal for the two electrodes or there may be a deliberate imbalance to compensate for the effects of the chamber dimensions which may require a greater power feed in some areas to maintain uniformity of the etching.

Use of the chuck is not confined to semiconductor wafers and it may be used with a number of different materials. It may be used in a materials handling system in which wafers or any other workpieces are to be picked and moved, generally referred to as pick and place systems.

An optional step that improves the chuck holding force is a burnishing step after the oxide has been formed and either before or after assembly. The chuck is placed on a granite surface block or other nonconductive smooth surface free of impurities and held down with a pressure of one to five pounds. Rubbing the chuck on the block for two minutes improved the gas leak rate by a factor of more than two. Holding force is conveniently measured by the gas pressure required to free the wafer from the chuck. Since the initial holding force is satisfactory, the voltage applied to the chuck electrodes can be reduced, placing less stress on the dielectric and resulting in longer life.

It has been found that at temperatures greater than 20° C. there is a substantial leakage current between electrodes 100 and 200 if a filled epoxy system of nominal thickness 0.001 inch to 0.002 inch is used as the bonding agent. This is surprising as both alumina and typical fillers such as boron nitride are good insulators. This leakage comes from mobile ions remaining after the anodization step that flow through the oxide coating, progressively weakening it. Preferably, an organic coating or an epoxy having a low ion mobility is used to block the flow. A film of polyimide (trade mark of dupont) 0.001" thick is inserted between electrodes 100 and 200 in order to reduce the leakage current along the vertical surfaces and below electrode 100. With this approach, a typical leakage current is reduced from >10μA to <1μA at 100° C. Dipping the electrodes in an organic material such as polyimide resin may also be used.

Figure 5:
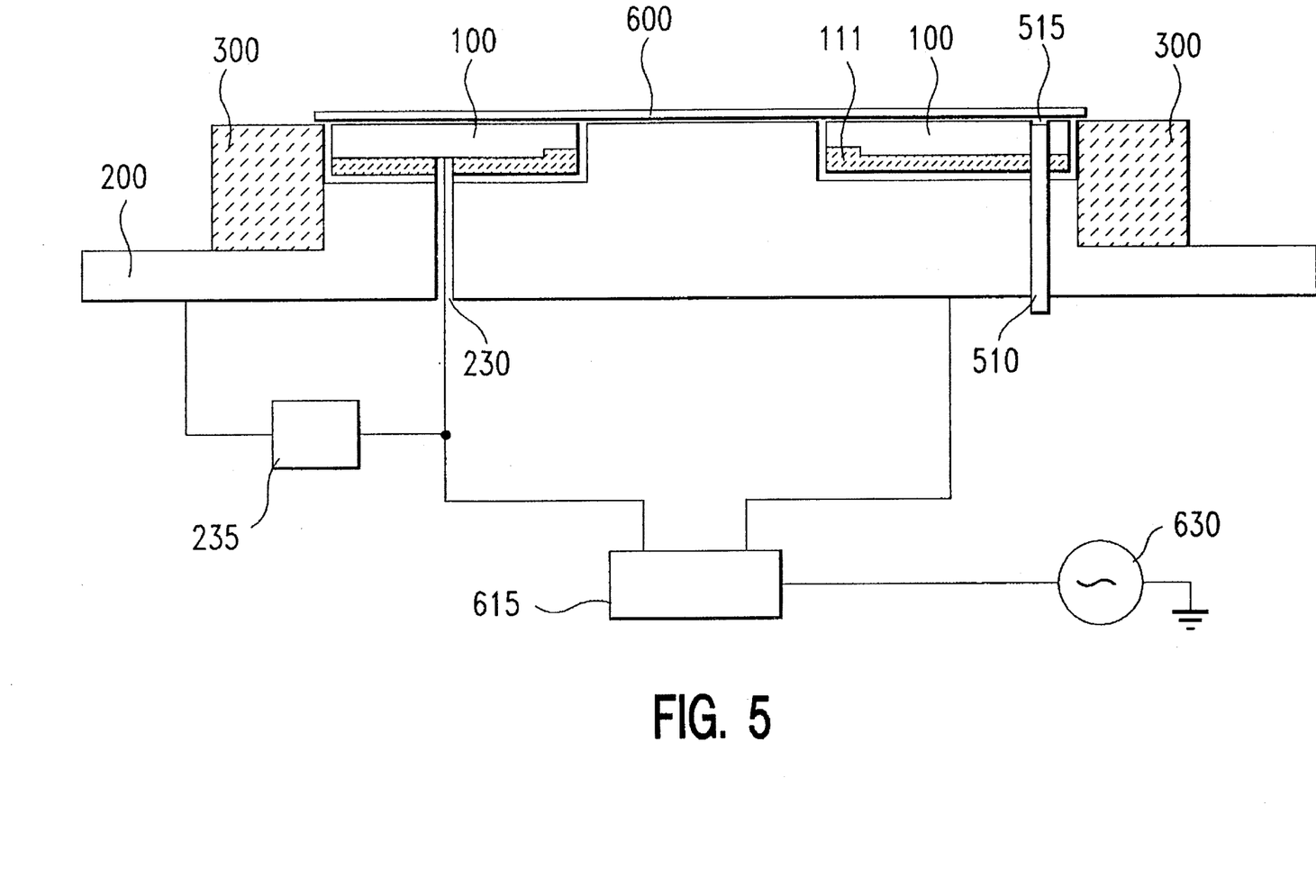
FIG. 5 illustrates an alternative embodiment of the invention.

Referring now to FIG. 5, there is illustrated another embodiment in which the electrodes 100 and 200 are electrically decoupled, in contrast to the earlier versions in which RF power was transmitted to the "donut" electrode 100 by capacitive coupling. In this version, isolation ring 111, illustratively formed from alumina, boron nitride or any other insulator with relatively good thermal properties, has a vertical thickness sufficient to decouple the electrodes. In the version of FIG. 4, there would be two steps at the inner and outer edges of the ring. For the 200 mm chuck illustrated, the capacitance between the electrodes is preferably less than 500 pf. The shape of ring 111 is not a simple ring, but has a higher portion on the inner radius. The reason for this extra-cost option is to reduce the capacitance between electrodes 100 and 200 to tailor the RF power distribution.

The radial gap between the electrodes should be relatively small, (0.020 inch) in order to have strong fringing fields for a good grip on the workpiece, but a close gap increases the capacitance. The ring is not extended up to the surface because of the above constraint from the fringing fields and also because the thermal conductivity of ceramic is much less than that of aluminum, so that there would be a radial temperature discontinuity if the ceramic did extend up to the surface. Those skilled in the art will appreciate that the final dimensions will depend on the usual engineering tradeoffs, including the sensitivity of the process to radial differences in coupled RF power, differences in temperature and wafer clamping force. In the embodiment illustrated, ring 111 was 0.125 inch thick in the main portion and was 0.340 inch thick in the inner portion. The nominal thickness of electrode 100 at the inner radius was 0.125 inch.

Note that this embodiment lacks the outer rim 210 of the embodiment of FIG. 1, so that the gas feed groove 515 is in electrode 100. The embodiment also has a dielectric field shaping ring 300 to maintain the field lines perpendicular to the wafer. The box labelled 615 represents the coupling circuit illustrated in FIG. 6, in which DC power supply 635, isolated by RF chokes and capacitively shunted to ground in a conventional fashion, is connected to electrodes 100 and 200 in parallel with a capacitive coupler in which a small fixed capacitor C2 is in parallel with a variable capacitor C3 that is used to tune to compensate for radial variations in plasma generation caused by non-uniform fields reflecting the geometry of the chamber that affect the plasma above electrode 100 differently from that above electrode 200. There is a frequency-dependent conductivity of the wafer that implies that the system will work better at higher frequency.

We claim:

1. A method of manufacturing an electrostatic chuck for holding a workpiece by electrostatic attraction comprising the steps of:

machining a base electrode from an aluminum alloy, said base electrode having an electrode recess machined in a top surface thereof for receiving a second electrode, said recess having inner and outer recess side surfaces and a recess bottom surface at a recess depth below said top surface and connected to said recess side surfaces by second transition regions having a first radius of curvature, thereby defining a first recess transverse distance between said inner and outer recess side surfaces;

machining said second electrode to match said recess, said second electrode including a bottom surface with a second transverse distance less than said first recess transverse distance, a second inner side surface corresponding to said inner recess side surface and a second outer side surface corresponding to said outer recess side surface, and a second thickness at least as great as said recess depth;

oxidizing at least those portions of both said base electrode and said second electrode that are to be bonded together with an electrode thickness of aluminum oxide, so that said base electrode has an oxidized recess with an oxidized recess bottom surface and oxidized recess side surfaces, and said second electrode has an oxidized bottom surface and oxidized second side surfaces, said thickness of aluminum oxide, said first recess transverse distance and said second transverse distance being related such that inner and outer recess gaps are present between said base electrode and said second electrode when said base and second electrodes are assembled;

coating at least one of said recess bottom and side surfaces and said electrode bottom and side surfaces with a first layer of thermally conductive electrically insulating bonding agent;

assembling and bonding together said base and second electrodes with said first layer of thermally conductive electrically insulating bonding agent:

machining the top surfaces of both said base and second electrodes to form a common top surface;

simultaneously machining transition radii between said common top surface and between said inner recess side surface and said second inner side surface down to an inner groove depth;

simultaneously machining transition radii between said common top surface and between said outer recess side surface and said second outer side surface down to an outer groove depth;

anodizing said common top surface and said transition radii; and filling grooves between the side surfaces of said base and second electrodes with a second layer of thermally conductive electrically insulating bonding agent.

2. The method according to claim 1, further including an additional step of removing aluminum particles from between said inner recess side surface and said second inner side surface and from between said outer recess side surface and said second outer side surface by machining said first layer of insulating bonding agent below said inner groove depth and below said outer groove depth, thereby forming a new top surface for said first layer of bonding agent below transition regions at the intersection of said transition radii and said recess side surfaces and said second side surfaces, so that said aluminum particles are removed and also an interface between said first and second layers of bonding agent is displaced from said transition regions.

3. The method according to claim 2, in which said step of machining said common top surface in said base and second electrodes includes machining at least one azimuthal gas distribution groove in a top surface of at least one of said base and second electrodes while ensuring that said azimuthal gas distribution groove does not connect with a radial gas distribution groove which in turn connects to a gas inlet, said azimuthal gas distribution groove having a radius less than an outer radius of said chuck by a radial impedance distance, whereby in operation cooling gas diffuses radially inward from said azimuthal gas distribution groove through interstices between said common top surface and said workpiece and said cooling gas maintains a cooling gas pressure by flowing radially outward from said azimuthal gas distribution groove through an impedance formed by interstices between said common top surface and said workpiece along said impedance distance.

4. The method according to claim 2, further including inserting a decoupling insulator between said second electrode and said base electrode, said decoupling insulator having a decoupling thickness sufficient to reduce RF power capacitively coupled between said base and second electrodes below a threshold amount and further including a step of forming terminals on said base and second electrodes for connecting said base and second electrodes to a source of RF power.

5. The method according to claim 1 in which said step of assembling said base and second electrodes includes a step of inserting a strip of organic insulating film between said base and second electrodes in said inner and outer recess gaps, and said coating step includes coating the bottom and side surfaces of both of said base and second electrodes with a first layer of bonding agent, so that said first layers of bonding agent bond said insulating film to both said base and second electrodes.

6. The method according to claim 5, further including inserting a decoupling insulator between said second electrode and said base electrode, said decoupling insulator having a decoupling thickness sufficient to reduce RF power capacitively coupled between said base and second electrodes below a threshold amount and further including a step of forming terminals on said base and second electrodes for connecting said base and second electrodes to a source of RF power.

7. The method according to claim 1, in which said step of machining said common top surface in said base and second electrodes includes machining at least one azimuthal gas distribution groove in a top surface of at least one of said base and second electrodes while ensuring that said azimuthal gas distribution groove does not connect with a radial gas distribution groove which in turn connects to a gas inlet, said azimuthal gas distribution groove having a radius less than an outer radius of said chuck by a radial impedance distance, whereby in operation cooling gas diffuses radially inward from said azimuthal gas distribution groove through interstices between said common top surface and said workpiece and said cooling gas maintains a cooling gas pressure by flowing radially outward from said azimuthal gas distribution groove through an impedance formed by interstices between said common top surface and said workpiece along said impedance distance.

8. The method according to claim 1, further including a step of machining the bottom of said second electrode to accommodate a decoupling insulator having a decoupling thickness sufficient to reduce RF power capacitively coupled between said base and second electrodes below a threshold amount and further including a step of forming terminals on said base and second electrodes for connecting said base and second electrodes to a source of RF power.

* * * * *